(12) United States Patent
Avants et al.

(10) Patent No.: US 7,157,952 B2
(45) Date of Patent: Jan. 2, 2007

(54) SYSTEMS AND METHODS FOR IMPLEMENTING DELAY LINE CIRCUITRY

(75) Inventors: Bradley S. Avants, Rowlett, TX (US); Arturo Yanez, Greenville, TX (US)

(73) Assignee: L-3 Integrated Systems Company, Greenville, TX (US)

( * ) Notice: Subject to any disclaimer, the term of this patent is extended or adjusted under 35 U.S.C. 154(b) by 0 days.

(21) Appl. No.: 10/922,803

(22) Filed: Aug. 20, 2004

(65) Prior Publication Data

US 2006/0038599 A1    Feb. 23, 2006

(51) Int. Cl.
*H03H 11/26* (2006.01)
(52) U.S. Cl. .................................. 327/276; 327/270
(58) Field of Classification Search .................. None
See application file for complete search history.

(56) References Cited

U.S. PATENT DOCUMENTS

| | | | |
|---|---|---|---|
| 5,703,515 A * | 12/1997 | Toyama et al. ............. | 327/294 |
| 5,963,074 A | 10/1999 | Arkin ......................... | 327/276 |
| 6,051,999 A * | 4/2000 | To et al. ..................... | 327/66 |
| 6,092,030 A * | 7/2000 | Lepejian et al. ............. | 702/79 |
| 6,104,223 A | 8/2000 | Chapman et al. ........... | 327/276 |
| 6,121,810 A * | 9/2000 | Philpott ...................... | 327/270 |
| 6,127,869 A * | 10/2000 | Hirasaka ..................... | 327/261 |
| 6,385,101 B1 * | 5/2002 | Chang et al. ............... | 365/196 |
| 6,426,721 B1 * | 7/2002 | Obara ......................... | 342/375 |
| 6,621,315 B1 * | 9/2003 | Heo et al. ................... | 327/158 |
| 2005/0168260 A1 * | 8/2005 | Tomerlin et al. ........... | 327/278 |

OTHER PUBLICATIONS

Search Report; PCT/US05/29369; Jun. 20, 2006; 11 pgs.

* cited by examiner

*Primary Examiner*—Timothy P. Callahan
*Assistant Examiner*—Cassandra Cox
(74) *Attorney, Agent, or Firm*—O'Keefe, Egan & Peterman LLP (57) ABSTRACT

Memory devices used to control delay line circuitry, and that may be implemented in one embodiment to provide a self-tuning delay line device using empirical calibration technique/s to achieve a desired signal delay. The memory control device may be implemented to store electrical characteristics of the delay line circuitry during testing to enable self-calibration of the delay line circuitry.

63 Claims, 5 Drawing Sheets

SYSTEMS AND METHODS FOR IMPLEMENTING DELAY LINE CIRCUITRY

This invention was made with United States Government support under Contract No. F33657-00-G-4029-0204. The Government has certain rights in this invention.

BACKGROUND OF THE INVENTION

1. Field of the Invention

This invention relates generally to signal delay, and more particularly to delay line circuitry.

2. Description of the Related Art

A delay line is a circuit designed to introduce a calculated time delay into the transmission of a signal. Delay lines may be used for different purposes including, for example, phase shifting, time shifting, etc. Most delay line applications require that delay lines be tuned or adjusted. For example, in the field of microwave phase shifting, creation of accurate microwave phase shifters and delay lines requires labor to tune a device during test. Without tuning, the tolerances in the dielectric of the material and manufacturing process make it impossible to create accurate and repeatable designs. There are many different types of delay lines and delay line adjustment techniques may vary according to topology. For example, when working with coaxial cables, mircrostrip, stripline and coplanar waveguide technologies, common delay techniques that have been employed include use of tuning stubs, adding to or trimming transmission lines, adding capacitors, etc. Such techniques are relatively labor intensive and time consuming.

Phased array apparatus are employed in a variety of applications for transmitting and receiving radar and other types of radio-frequency (RF) signals, and may be implemented in a variety of geometric array configurations. Examples of array configurations include linear arrays, two-dimensional arrays, planar arrays, rectangular arrays and conformal arrays. Phase shifting devices have been used to alter the phase of signals transmitted or received by individual phased array elements relative to each other in order to control the directional orientation of signals transmitted or received by the array. Examples of phase shifting devices include digital phase shifting devices (e.g., diode phase shifter using switched-line, hybrid-coupled and loaded-line) and analog phase shifting devices that are digitally controlled (e.g., ferrite phase shifter). In the latter case, phase shifters using ferrite materials are found in high power applications, but they are generally relatively large in size. Ferrite phase shifters utilize the magnetic hysteresis of a ferrite material to provide a phase shift when a bias field is applied to the material. However, a full characterization of the ferrite material must be made since the hysteresis curves are unique for each device made out of the same ferrite material.

SUMMARY OF THE INVENTION

Disclosed herein are systems and methods that may be implemented using memory devices to control delay line circuitry. In this regard, examples of memory devices that may be employed to control delay line circuitry include any memory device suitable for storing one or more characteristics of delay line circuitry. Examples include, but are not limited to, electrically-erasable non-volatile memory devices (e.g., such as electrically erasable programmable ROM ("EEPROM") memory devices, FLASH memory devices, Compact FLASH devices, etc.), magnetic disks, etc. In one exemplary embodiment, relatively inexpensive and dense non-volatile memory in the form of FLASH memory devices may be employed.

Using the disclosed systems and methods, such memory devices may be advantageously used to reduce manufacturing time and skill level required for assembly of delay line circuitry. For example, the disclosed systems and methods may be implemented to partially or fully automate the testing of delay lines so as to eliminate manual trimming/tuning tasks, and to eliminate the necessity of keeping a reference unit available and/or the need for manufacturing of phase matched sets. By eliminating the need for manual touch labor to tune delay lines, test time and costs associated with delay line tuning may be advantageously reduced, especially when large numbers of delay lines are involved, e.g., in the case of large phased arrays. The disclosed systems and methods may be employed in application suitable for delay line circuitry including, but not limited to, phased array antennas (e.g., electrically steered phased array antennas, broad band wide scan angle phased array antennas, broad band multi-octave phased array antennas, etc.), beamforming networks, microwave phase shifters, radar systems, ECM systems, space communication systems, cellular base stations, direction finding systems, etc.

In one embodiment, the disclosed systems and methods may be implemented to provide a self-tuning delay line device, such as a self-tuning programmable phase shifting device, for example, using empirical calibration technique/s to achieve a desired signal delay. The self-tuning delay line device may include one or more memory control device/s and digital logic provided in the delay line circuitry to control the delay elements or bits of the delay line circuitry so as to calibrate the delay line circuitry to achieve a desired signal delay in a manner that is independent to the calibration of individual delay elements in the delay line circuitry. In this regard, the memory control device may be implemented to store electrical characteristics of the delay line circuitry (e.g., delay bit characteristics, amplitude response, phase response, etc.) during testing, thus enabling self-calibration of the delay line circuitry (e.g., without the need for expensive tuning of individual delay elements during production).

In another embodiment, the disclosed systems and methods may be implemented to provide a firmware-controlled delay line device (e.g., firmware-controlled microwave phase shifter) that incorporates internal memory device/s (e.g., FLASH memory device/s or any other electrically erasable memory device/s) to serve as a lookup table for self-calibration. Unlike conventional phase shifting devices that require tight manufacturing tolerances and physical tuning to achieve desired phase shift accuracy, the firmware-controlled delay line device of this embodiment may be implemented using a manual and/or automated calibration method to program a delay (e.g., phase shift) correction into the delay line device itself without the need for such tight manufacturing tolerances and/or physical tuning. This self-calibration methodology may be implemented to eliminate expensive tuning time and difficult manufacturing processes.

In one respect, disclosed herein is delay line circuitry configured to receive and delay an input signal to produce a delayed output signal, the delay line circuitry including: a plurality of delay elements; and delay element control circuitry configured to control the plurality of delay elements to produce the delayed output signal based at least in part on delay element setting information provided by at least one memory device.

In another respect, disclosed herein is delay line circuitry configured to receive and delay an input signal to produce a delayed output signal, the delay line circuitry including: a plurality of delay elements; and delay element control circuitry configured to control the plurality of delay elements to produce the delayed output signal, the delay element control circuitry including at least one memory device.

In another respect, disclosed herein is a phased array apparatus, including: a plurality of array elements; and a plurality of phase shifting devices, each of the plurality of phase shifting devices being coupled to a respective one of the plurality of array elements. Each of the plurality of phase shifting devices may include a plurality of delay elements, and delay element control circuitry configured to control the plurality of delay elements based at least in part on delay element setting information provided by at least one memory device.

In another respect, disclosed herein is a method of delaying an input signal to produce a delayed output signal using a plurality of delay elements coupled to receive and delay the input signal to produce the delayed output signal. The method may include controlling the plurality of delay elements to produce the delayed output signal based at least in part on delay element setting information provided by at least one memory device.

In another respect, disclosed herein is a method of operating a phased array apparatus, including: providing a plurality of array elements; providing a plurality of phase shifting devices, each of the plurality of phase shifting devices including a plurality of delay elements and being coupled to a respective one of the plurality of array elements; and varying the phase of a signal transmitted or received by each respective one of the array elements by controlling the plurality of delay elements of the respective phase shifting device coupled to the respective array element based at least in part on delay element setting information provided by at least one memory device.

In another respect, disclosed herein is test circuitry configured for coupling to delay line circuitry that has a plurality of delay elements and that has delay element control circuitry configured to control the plurality of delay elements to produce a delayed output signal based at least in part on delay element setting information provided by at least one memory device. The test circuitry may include circuitry configured to derive the delay element setting information for storage in the memory device.

DESCRIPTION OF ILLUSTRATIVE EMBODIMENTS

Figure 1A:
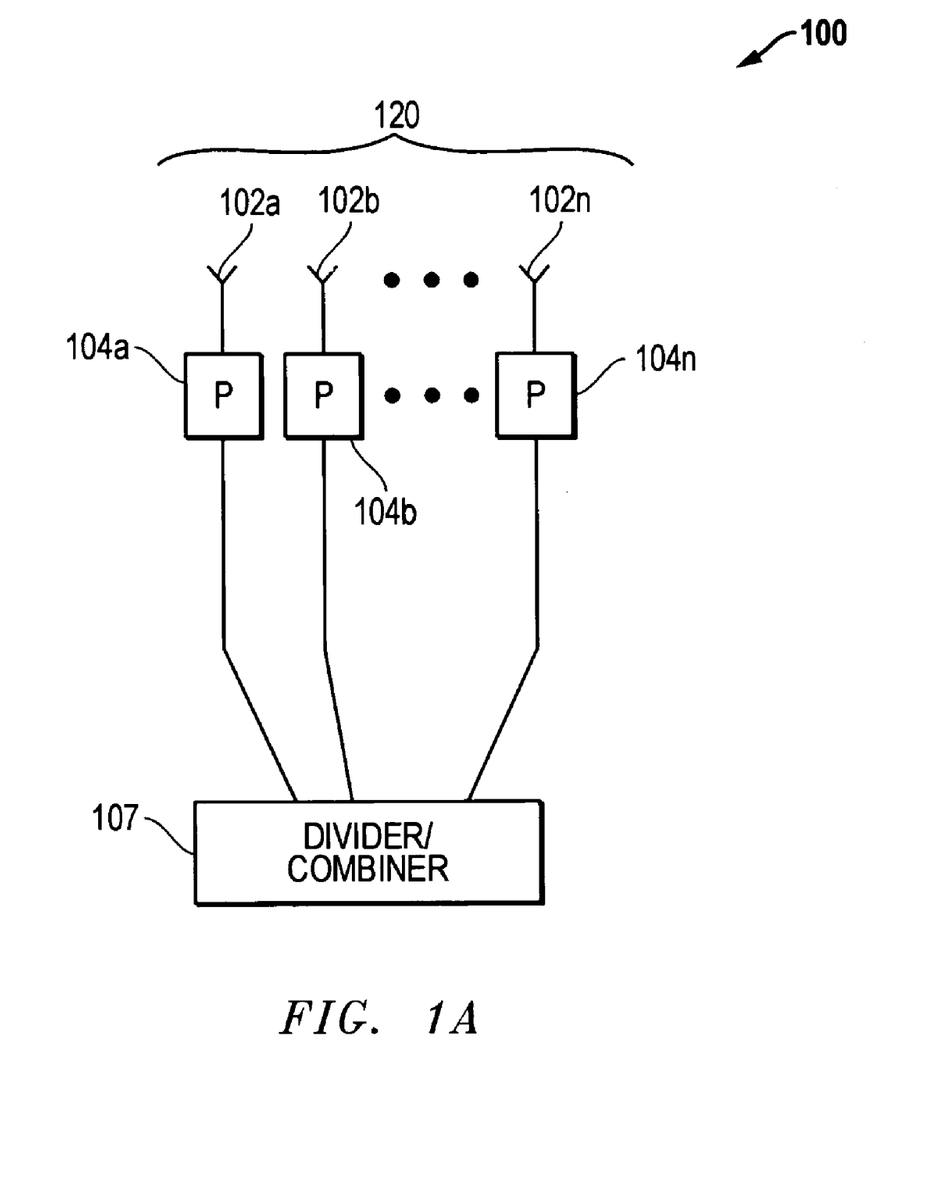
FIG. 1A is a block diagram of a phased array antenna system according to one embodiment of the disclosed systems and methods.

FIG. 1A is a simplified block diagram of a phased array antenna system 100 according to one embodiment of the disclosed systems and methods. As illustrated in FIG. 1A, antenna system 100 includes an antenna array 120 made up of multiple antenna elements $102_a$ through $102_n$. As shown, each of multiple antenna elements $102_a$ through $102_n$ are coupled to a respective delay line circuits $104_a$ through $104_n$ provided as phase shifting devices, each of which is in turn coupled to signal divider/combiner 107 that is configured to combine separate signals received by separate antenna elements antenna elements $102_a$ through $102_n$, and/or to divide separate signals to be transmitted by separate antenna elements $102_a$ through $102_n$, as appropriate. In the illustrated phased array antenna system embodiment, each delay line circuit 104 may be digitally controlled to independently vary the phase of radiation or other type of signal transmitted or received by the respective element 102 coupled to the delay line circuit, e.g., relative to the phase of signals transmitted or received by other elements 102 of the array 120. As will be further explained, by so independently varying the phase signals are transmitted or received by each element 102 relative to each other element 102, the direction of maximum signal intensity transmitted or received by antenna array 120 may be controlled.

Figure 1B:
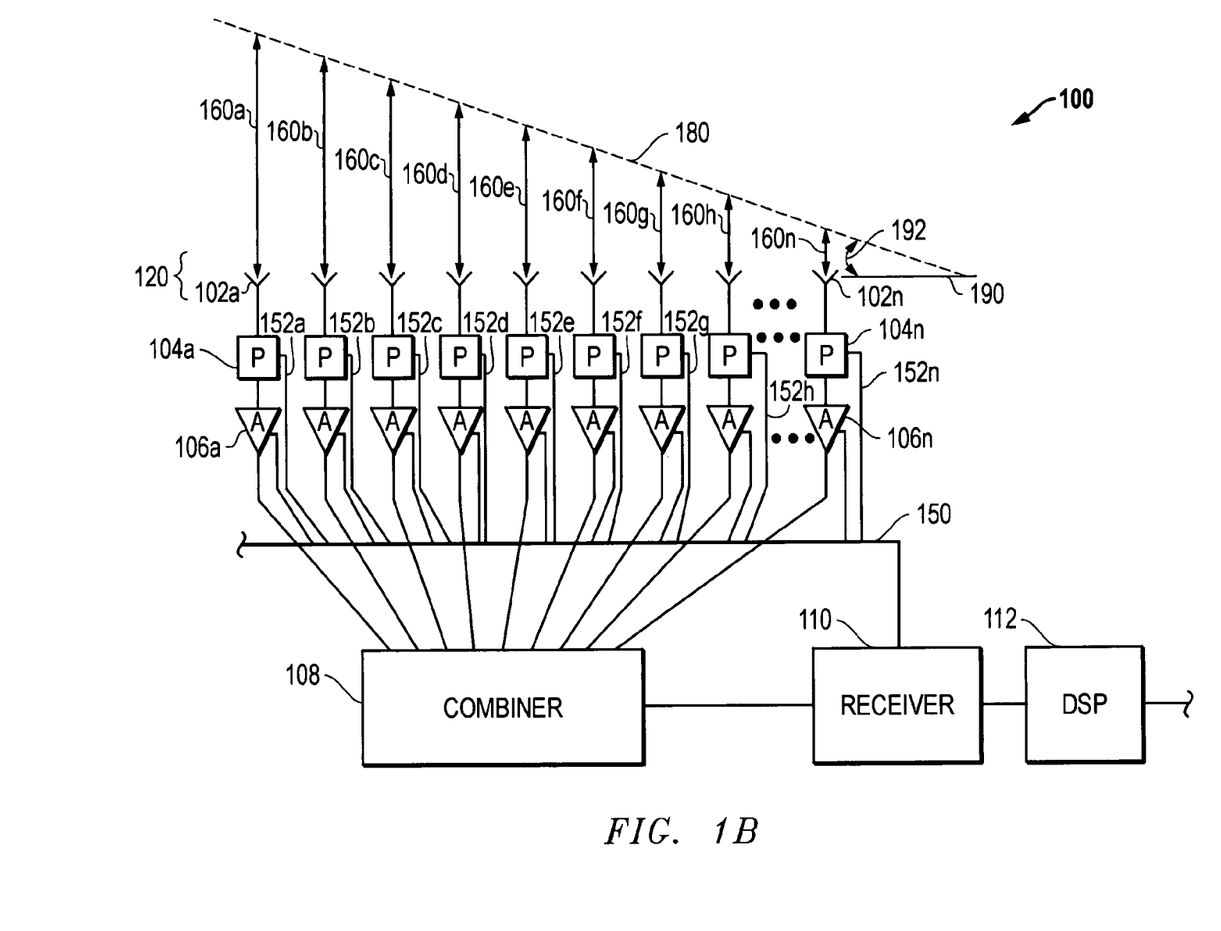
FIG. 1B is a block diagram of a phased array antenna system according to one embodiment of the disclosed systems and methods.

FIG. 1B illustrates one exemplary embodiment of a phased array antenna system 100 having an antenna array 120 made up of multiple antenna elements 102 as it may be implemented to receive a directional signal wave front 180. Phased array antenna system 100 is illustrated configured as a receive-only system in FIG. 1B. However, it will be understood that in alternate embodiments a phased array antenna system 100 may be alternatively configured as a transmit only system (e.g., with divider circuitry coupled between a transmitter and phase shifting devices to divide separate signals to be transmitted by separate antenna elements $102_a$ through $102_n$), or may be alternatively configured as a transmit and receive system (e.g., with combiner/divider circuitry coupled between a transceiver and phase shifting devices to combine separate signals received by separate antenna elements antenna elements $102_a$ through $102_n$ and to divide separate signals to be transmitted by separate antenna elements $102_a$ through $102_n$). In this regard, it will be understood that the disclosed phase shifting methods and apparatus may be employed to vary the phase of transmitted signals in a manner similar to the process of varying the phase of received signals discussed in relation to the exemplary embodiment of FIG. 1B.

As illustrated in FIG. 1B, each delay line circuit $104_a$ through $104_n$ is coupled as a phase shifting device to a respective amplifier $106_a$ through $106_n$, each of which is in turn coupled to combiner 108. Combiner 108 is shown coupled to receiver 110 and digital signal processor (DSP) 112. A control bus 150 is provided that provides control signals 152a through 152n from receiver 110 to each of each delay line circuits $104_a$ through $104_n$ and amplifiers $106_a$ through $106_n$. Using phase shifting device control signals provided by receiver 110, each delay line circuit 104 may be digitally controlled as a phase shifting device to independently vary the phase of radiation or other type of signal received by the respective element 102 relative to the phase of signals received by other elements 102 of the array 120. Using amplifier control signals provided by receiver 110, gain of each amplifier 106 may be optionally controlled relative to the gain of each other amplifier 106 to further control the pattern of signals received by antenna array 120.

FIG. 1B shows radiation or signal wave front 180 being received by antenna array 120 and having a longitudinal axis that is oriented at an angle with respect to the longitudinal axis 190 of antenna array 120. In the illustrated embodiment, the angle of orientation 192 of signal wave front 180 with antenna array 120 is controlled by individual signal delay times $160_a$ through $160_n$ that are imparted by respective phase shifting devices $104_a$ through $104_n$ in response to digital control signals provided by receiver 110. In this regard, the magnitude of individual signal delay times $160_a$ through $160_n$ may be cooperatively increased so as to increase magnitude of angle 192, or may be cooperatively decreased to decrease the magnitude of angle 192. When the magnitude of individual signal delay times $160_a$ through $160_n$ are set to be equal, the wave front angle 180 is 0° and energy wave front 180 is oriented parallel to the longitudinal axis 190 of antenna array 120.

It will be understood with benefit of this disclosure that FIGS. 1A and 1B illustrate embodiments of delay line circuitry as they may be implemented as part of exemplary phased array antenna systems in the practice of the disclosed systems and methods. In this regard, delay line circuitry of the disclosed systems and methods may be advantageously implemented to delay signals in a variety of other signal delay environments including, but not limited to, radar systems, EMC systems, cellular base stations, space communication systems, direction finding systems, etc.

Furthermore, it will be understood that the illustrated phased array antenna systems of FIGS. 1A and 1B illustrate only exemplary embodiments of phased array antenna systems as they may be implemented in the practice of the disclosed systems and methods. In this regard, the number and geometrical configuration of antenna elements, and/or the configuration and identity of processing circuit components coupled thereto, may be selected and varied as needed or desired to achieve the desired signal receiving and/or transmitting characteristics of a given antenna system application. For example, the specific configuration of elements, phase shifters, amplifiers, divider, combiner, transceiver and/or digital signal processor ("DSP") may be changed (e.g., position of amplifiers relative to phase shifting devices may be changed, control scheme for phase shifting devices and/or amplifiers changed, etc.), and/or the number and types of components changed (e.g., no DSP present; transceiver or transmitter substituted for receiver; combiner/divider or divider substituted for combiner; individual transceiver, receiver or transmitter directly coupled to each phase shifting device without presence of an intervening combiner/divider, combiner or transmitter; with no amplifiers coupled to phase shifting devices and using unamplified signals; etc.). Furthermore, an antenna array may be of any geometrical configuration suitable for implementation as a phased array including, for example, linear array, two and three-dimensional array, planar array, rectangular array, conformal array, etc.

In addition, although FIG. 1B shows control signals provided by receiver 110 through control bus 150, it will be understood that control for phase shifting devices 104 and/or amplifiers 106 may be provided in any suitable manner, e.g., by analog or digital control signals supplied by receiver 110, DSP 112, or by any other device capable of supplying suitable control signals. Furthermore, it will be understood that the disclosed systems and methods may be implemented without amplifiers 106 and/or without control provided over amplifiers 106. In addition, a group of multiple antenna elements 102 may be coupled to a single delay line circuit 104, and an antenna array 120 may be thus formed from individual groups of antenna elements 120 (i.e., rather than formed from single antenna elements 120). In such an implementation, the phase of signals transmitted or received by a given group of antenna elements may be independently varied by its respective phase shifting device relative to the phase of signals transmitted or received by other groups of antenna elements to achieve directional control over the received or transmitted signals.

Furthermore, it will be understood that the disclosed systems and methods may be implemented with any other type of phased array antenna system, with any other type of antenna system having multiple antenna elements, or with any other type of apparatus or system employed to phase shift a signal or to phase shift multiple signals relative to each other (e.g., apparatus or system having multiple phased array elements). In this regard, the disclosed systems and methods may be implemented with any apparatus configured to receive and/or transmit signals of any frequency or frequency range suitable for propagation through a variety of media including, but not limited to, gaseous medium (e.g., air), solid medium (e.g., earth, tissue), vacuum, etc. Examples of types of apparatus and systems that may be implemented with the disclosed systems and methods include, but are not limited to, phased array radio frequency (RF) antennas, beamformers, or other type/s of RF sources or components; sonar arrays (for transmitting/receiving acoustic signals); ultrasonic arrays (ultrasonic signals for medical and flaw analysis imaging purposes); radar arrays (e.g., for bi-static and mono-static radar); mobile and land based telecommunications devices; seismic arrays; etc. Examples of specific types of phased array RF antennas that may be implemented with the disclosed systems and methods include, but are not limited to, narrow band phased array antennas, broad band phased array antennas, etc. In one embodiment, the disclosed systems and methods may be implemented at any RF frequencies where phased array antennas may be employed (e.g., HF band, KA band, M band, etc.) In another exemplary embodiment, the disclosed systems and methods may be employed in surveillance applications (e.g., airborne, ship-based, space-based, submarine based, etc.) including, but not limited to, as a part of a tactical reconnaissance system.

Figure 2:
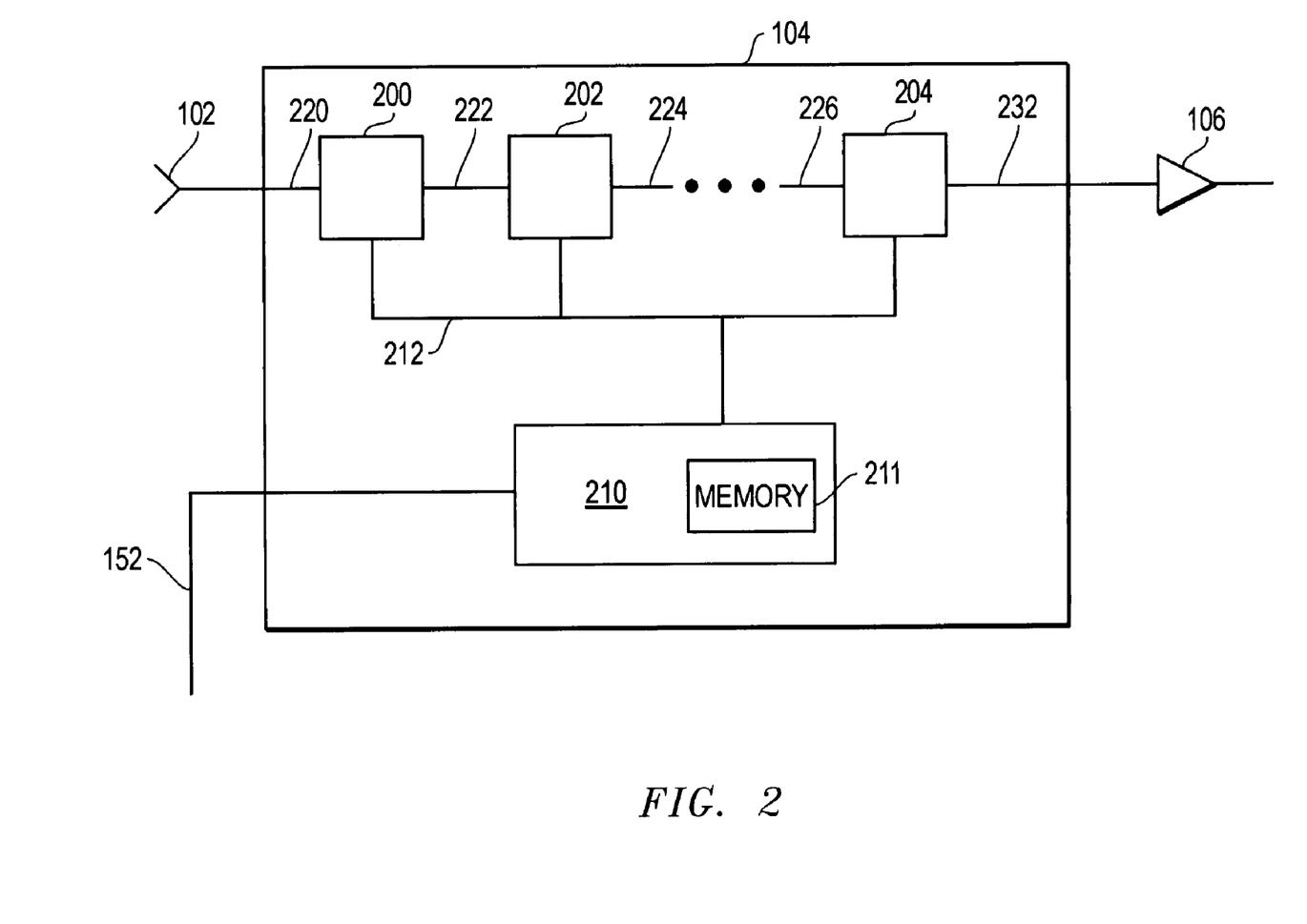
FIG. 2 is a block diagram showing a phase shifting device coupled between an antenna element and amplifier according to one embodiment of the disclosed systems and methods.

FIG. 2 illustrates one embodiment of an individual delay line circuit 104 that is coupled as a phase shifting device (e.g., microwave phase shift device) between antenna element 102 and amplifier 106. As shown, delay line circuit 104 has a configuration including a number N of delay elements 200, 202, and 204 coupled together in series. Each of N delay elements 200, 202, and 204 are coupled to delay element control circuitry 210 via delay element control signal bus 212. It will be understood that a delay line circuit may include any suitable number N of delay elements (e.g., two or more) as desired or necessary to fit the requirements of a given application in a manner as will be described further herein. Furthermore, it will be understood that the delay elements of the disclosed systems and methods may be implemented using any type of delay device or combinations of delay devices effective for implementing one or more features of the delay line circuitry described herein (e.g., transmission line delay devices, magnetic toroidial transformer delay devices, optical delay devices, lumped element delay devices, etc.).

Still referring to the exemplary delay line circuit 104 of FIG. 2, each of N delay elements 200 through 204 may be of any configuration suitable for producing a delayed output signal by imparting a delay to a given input signal, e.g., in the exemplary phase shifting embodiment of FIG. 2 any configuration suitable for receiving a respective input signal 220, 222 or 226 and for producing a respective delayed or phase shifted output signal 222, 224 or 232 based on the respective input signal. Although FIG. 2 illustrates a phase shifting embodiment that may employ a delay line circuit 104 to process and phase shift an RF input signal 220, it will be understood that in other embodiments a delay line circuit may be configured to process and delay a variety of types of signals, e.g., acoustic signals, ultrasonic signals, radar signals, seismic signals, etc.

In the illustrated exemplary embodiment, each of N delay elements 200 through 204 may be selectably controlled to delay and shift the phase of its respective input signal (i.e., 220, 222 or 226) in response to a respective control signal received from delay element control circuitry 210 via delay element control signal bus 212. For example, in one mode of operation, delay element 200 may be controlled to produce output signal 222 by delaying and shifting the phase of input signal 220 (e.g., using a transmission line delay device or other suitable type of delay device), while at the same time at least one other delay element is controlled to impart substantially no delay or phase shift to its respective input signal, i.e., so that it produces an output signal having no delay or phase shift or having only a small amount of delay or phase shift relative to the delay or phase shift imparted by delay element 200 (e.g., delay element 202 may be controlled to produce output signal 224 having the same phase, or having a phase that is relatively close in phase to input signal 222).

As further illustrated in FIG. 2, delay element control circuitry 210 may be coupled to receive control signal 152 from receiver 110, DSP 112, or from any other device/s capable of supplying suitable control signals. In this regard, control signal 152 may include control information that is at least partially indicative of a signal delay that is to be imparted by delay line circuit 104. As shown, delay element control circuitry 210 of delay line circuit 104 may be configured to include one or more memory device/s 211 that contain delay element setting information (e.g., look up table/s, algorithm/s, correlation/s, relationship/s, etc.) suitable for determining delay bit or value settings for N delay elements 200 through 204 based at least in part on control information contained in control signal 152 (i.e., determining which one or more of N delay elements 200 through 204 are to be selectably controlled to shift the phase of their respective input signals). Examples of delay element setting information includes, but is not limited to, individual delay element values for each of N delay elements 200 through 204, correlation of individual delay element values as a function of desired phase shift value and frequency, etc. As so configured, delay element control circuitry 210 may be implemented to provide delay element control signals via control bus 212 for controlling N delay elements 200 through 204 based on information contained in received control signal 152.

Figure 3:
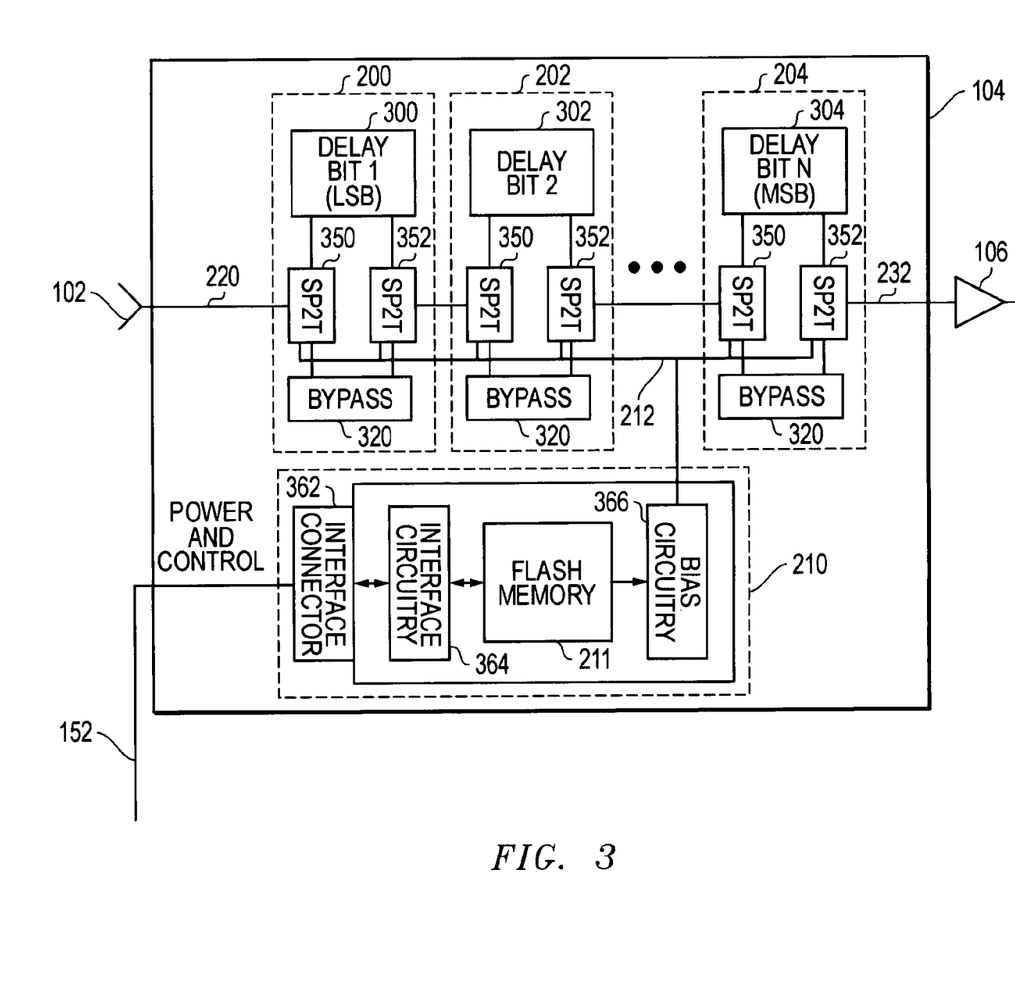
FIG. 3 is a block diagram showing a phase shifting device coupled between an antenna element and amplifier according to one embodiment of the disclosed systems and methods.

FIG. 3 illustrates one exemplary embodiment of an individual delay line circuit 104 of FIG. 2 configured as a phase shifting device (e.g., microwave phase shifter) in which each of N delay elements 200 through 204 are coupled in series with element 102, amplifier 106 and with other delay elements of delay line circuit 104. As shown, each of N delay elements 200 through 204 includes a respective delay bit or value 300, 302 or 304, e.g., a respective transmission line delay device having a length (or other type of suitable delay line device) that provides a given delay bit or value.

As shown, each of N delay elements 200 through 204 also includes a respective bypass path 320 coupled between a respective pair of switch modules 350 and 352 so that each of N delay elements 200 through 204 may be selectably controlled to delay and shift the phase of its respective input signal (i.e., 220, 222 or 226) in response to a respective control signal received from delay element control circuitry 210 via delay element control signal bus 212 in a manner as described below.

The respective switch modules 350 and 352 of each of N delay elements 200 through 204 are configured to operate in a cooperative manner so that an input signal to the given delay element may be selectably coupled to either the delay line device of the given delay element (i.e., to produce an output signal that is delayed or phase shifted relative to the input signal) or to the bypass path 320 of the given delay element (i.e., to produce an output signal that is substantially not delayed or that has substantially the same phase as the input signal). Thus, the delay characteristics of delay line circuit 104 may be controlled by selectably coupling in series any desired combination of delay line devices (e.g., 300, 302, and/or 304) and bypass lines 320 between the input signal 220 and output signal 232 of delay line circuit 104. In this manner, delay line circuit 104 may be selectably configured for providing maximum delay between input signal 220 and output signal 232 by coupling all N delay elements 200 through 204 between the input signal 220 and output signal 232 of delay line circuit 104. Conversely, delay line circuit 104 may be selectably configured to provide little or substantially no delay between input signal 220 and output signal 232 by coupling all bypass lines 350 of respective N delay elements 200 through 204 between the input signal 220 and output signal 232 of delay line circuit 104.

As illustrated in FIG. 3, control for switch modules 350 and 352 of delay line circuit 104 may be provided by control signals received from delay element control circuitry 210 via delay element control signal bus 212. For example, control bit 100000 may be defined to control delay element device 200, control bit 010000 may be defined to control delay element device 202, etc. Although pairs of switch modules 350 and 352 are illustrated provided for each N delay element in the exemplary embodiment of FIG. 3, it will be understood that any other circuit configuration may be employed that is suitable for toggling or otherwise switching or selecting between a given delay line device and a respective bypass path for each of N delay elements 200 through 204. Furthermore, although a delay element control signal bus 212 is illustrated herein, it will be understood that control signals may be provided from delay element control circuitry 210 to individual N delay elements of delay line circuit 104 using any suitable configuration, e.g., using separate control paths from delay line circuit 210 to each of N delay elements 200 through 204, etc.

As further illustrated in FIG. 3, delay element control circuitry 210 may be provided with interface circuitry 364 that may be coupled via interface connector 362 to receive control signal 152 from receiver 110, DSP 112, or from any other device/s capable of supplying suitable control signals. In FIG. 3, delay element control circuitry 210 of delay line circuit 104 is also shown including one or more memory devices in the form of FLASH memory devices 211 coupled between interface circuitry 364 (e.g., RS232 serial, Parallel TTL, LVTTL, IEEE 488, Ethernet, etc.) and bias circuitry 366 (e.g., Logic buffers, GaAs drivers, Current Drivers, level converters, etc). It will be understood FLASH memory device/s 211 is exemplary only, and that any other suitable form of memory device or combination of memory devices may be alternatively employed. In the illustrated embodiment, FLASH memory device/s 211 may contain delay element setting information suitable for determining delay bit or value settings for N delay elements 200 through 204 based at least in part on control information contained in control signal 152. FLASH memory device/s 211 is in turn coupled to bias circuitry 366 that is configured to provide delay element control signals via control bus 212 for controlling N delay elements 200 through 204 based on information contained in received control signal 152.

Table 1 represents a group of settings for N delay elements 200 through 204 that achieves the desired signal delay corresponding to a given combination of frequency (F) and phase shift (PS) values. Thus, for a given phase shift value and frequency value supplied by control signal 152, a corresponding delay bit selection (DlyBitSel) may be retrieved from FLASH memory 211. This retrieved delay bit selection may then be provided as delay element setting information to bias circuitry 366, which sets each of N delay elements 200 through 204 accordingly, e.g., to achieve a desired microwave phase shift.

TABLE 1

Delay Circuit Primary Lookup Table

|  | $PS_L + n\Delta p$ | $PS_L + n\Delta p$ | $PS_L + n\Delta p$ | $PS_L + n\Delta p$ |
|---|---|---|---|---|
| $F_L + x\Delta f$ | DlyBitSel $(PS_L)$ | DlyBitSel $(PS_L + \Delta p)$ | DlyBitSel $(PS_L + n\Delta p)$ | DlyBitSel $(PS_H)$ |
| $F_L + x\Delta f$ | DlyBitSel $(PS_L)$ | DlyBitSel $(PS_L + \Delta p)$ | DlyBitSel $(PS_L + n\Delta p)$ | DlyBitSel $(PS_H)$ |
| $F_L + x\Delta f$ | DlyBitSel $(PS_L)$ | DlyBitSel $(PS_L + \Delta p)$ | DlyBitSel $(PS_L + n\Delta p)$ | DlyBitSel $(PS_H)$ |
| $F_L + x\Delta f$ | DlyBitSel $(PS_L)$ | DlyBitSel $(PS_L + \Delta p)$ | DlyBitSel $(PS_L + n\Delta p)$ | DlyBitSel $(PS_H)$ |
| $F_L + x\Delta f$ | DlyBitSel $(PS_L)$ | DlyBitSel $(PS_L + \Delta p)$ | DlyBitSel $(PS_L + n\Delta p)$ | DlyBitSel $(PS_H)$ | where:
$F_L$ = Minimum frequency of operation
$\Delta f$ = Frequency step size
$F_H$ = Max frequency of operation
$\Delta p$ = Phase step size
n = Integer series from 0 to one less than the maximum number of desired phases
x = Integer series from 0 to one less than the maximum number of frequencies
DlyBitSel = Bit selection to obtain desired delay
$PS_H = PS_L + n\Delta p$ where n = one less than the maximum number of desired phases such that the total number of phase shift values is equal to "n + 1".
$F_H = F_L + x\Delta f$ where x = one less than the maximum number of frequencies such that the total number of frequencies is equal to "x + 1".

Still referring to the exemplary embodiment of FIG. 3, delay line circuit 104 may be configured to operate in one embodiment in the following manner. Control signals 152 containing control information (e.g., a frequency of interest and a desired phase delay) may be provided to interface circuitry 364, and in turn passed to FLASH memory device/s 211. FLASH memory device/s 211 may contain a lookup table or other suitable form of delay element setting information that may be accessed with the control information received from interface circuitry 364 to determine appropriate settings for each of N delay elements 200 through 204 (i.e., bypass path 320 or respective delay bit 300 through 364 for each respective delay element 200 through 204). This delay element setting information may then be provided from FLASH memory device/s 211 to bias circuitry 366 which, in turn, may provide the necessary voltages via control bus 212 to control switch modules 350 and 352 of each of N delay elements 200 through 204 that results in the appropriate settings for each of N delay elements 200 through 204 to cause the desired signal delay between input signal 220 and output signal 232 at the frequency of interest.

Table 1 illustrates one exemplary embodiment of a delay circuit primary look-up table that may be stored in a memory device of a delay line circuit, e.g., in FLASH memory 211 of delay line circuit 104 of FIG. 3. Table 1 contains delay element setting information that characterizes phase shifting capabilities of delay line circuit 104 by indexing delay bit selections (DlyBitSel) of circuit 104 by frequency (F) and phase shift (PS). As so provided, Table 1 may be used to determine delay bit selections (DlyBitSel) for N delay elements 200 through 204 based on control information including frequency and phase shift information contained in control signal 152. In this regard, each DlyBitSel value of Referring to the exemplary embodiment of Table 1 in more detail, a delay line circuit 104 may be configured to operate as a phase shifting device that provides a given number (n+1) of electrical phase shift values (PS) for a given frequency (F) that range from a minimum phase shift value or Phase Shift Low ($PS_L$) to a maximum phase shift value or Phase Shift High ($PS_H$), e.g., where a maximum number of phases equals 4, the value of n corresponding to $PS_L$ would equal to 0, and the value of n corresponding to $PS_H$ would equal to 3. Intervals between individual phase shift values for a given frequency may be defined by a phase step size ($\Delta p$) as shown, i.e., so that a given phase shift value may be defined by adding a multiple of the phase step size ($\Delta p$) to the minimum phase shift value ($PS_L$) up to the maximum phase shift value ($PS_H$). For a given frequency (F), Table 1 provides a DlyBitSel value corresponding to each defined phase shift value (PS), i.e., DlyBitSel ($PS_L$) corresponds to $PS_L$, DlyBitSel ($PS_L+n\Delta p$) corresponds to $PS_L+n\Delta p$, DlyBitSel ($PS_H$) corresponds to $PS_H$, etc. It will be understood that the four columns of phase shift values shown in Table 1 are illustrative only, and that a look-up table may be provided with any given number (e.g., n+1) of phase shift value columns suitable for characterizing the phase shift capabilities of a given phase shifting device.

As further shown in Table 1, a delay line circuit 104 may be configured to operate as a phase shifting device that provides a respective set of electrical phase shift values, ($PS_L$) through ($PS_H$), for each of a given number (x+1) of frequencies ranging between a minimum frequency of operation or Frequency Low ($F_L$) and a maximum frequency of operation or Frequency High ($F_H$), e.g., where a maximum number of frequencies equals 5, the value of x corresponding to $F_L$ would equal to 0, and the value of x corresponding to $F_H$ would equal to 4. Frequency intervals between individual frequency values may be defined by a frequency step size (Δf) as shown, i.e., so that a given frequency value may be defined by adding a multiple of the frequency step size (Δf) to the minimum frequency of operation ($F_L$) up to the maximum frequency of operation ($F_H$). It will be understood that the five rows of frequency values shown in Table 1 are illustrative only, and that a look-up table may be provided with any given number (e.g., x+1) of frequency value rows suitable for characterizing the frequency range capabilities of a given phase shifting device.

Table 2 illustrates one exemplary embodiment of a delay circuit primary look-up table for a 6 bit delay line. The delay bit selection numbers in the table are binary representations of the delay bit data. In this regard, each digit in the binary number corresponds to a given delay element.

TABLE 2

Delay Circuit Primary Lookup Table

| | PS = 10° | PS = 20° | PS = 350° | PS = 360° |
|---|---|---|---|---|
| F = 500 MHz | 0 0 0 0 1 0 | 0 0 0 1 1 0 | 1 1 1 1 0 0 | 1 1 1 1 0 1 |
| F = 550 MHz | 0 0 0 0 1 0 | 0 0 0 1 0 1 | 0 1 0 0 0 1 | 1 0 0 0 0 0 |
| F = 600 MHz | 0 0 0 0 0 1 | 0 0 1 0 0 1 | 0 0 1 0 0 0 | 1 0 0 1 0 1 |
| F = 950 MHz | 0 0 0 0 0 1 | 0 1 0 0 0 1 | 1 0 0 0 1 1 | 0 1 0 1 0 0 |
| F = 1000 MHz | 0 0 0 0 0 0 | 0 0 0 1 0 0 | 1 0 1 1 0 0 | 0 0 1 1 0 1 |

It will be understood that delay setting information may be generated or otherwise defined or created using any method suitable for providing a relationship between one or more desired signal delay values and corresponding settings for one or more delay elements of a given delay line circuit. For example, such information may be predefined based on known delay characteristics of individual delay elements of a delay line circuit, or may be empirically derived (e.g., by calibration measurements).

Tables 3 through 5 illustrate one exemplary embodiment of calibration methodology that may be employed to create delay element setting information for a given delay line circuit such as embodied in the exemplary look-up tables of Table 1 and Table 2. Such a calibration methodology may be implemented, for example, by defining a set of one or more desired delay values as illustrated in Table 3. In a phase shifting embodiment, one or more desired phase shift values and one or more frequencies may be chosen first, and then desired delay values may be chosen based on combinations of the desired phase shift values and frequencies. In this regard, it is possible that multiple desired delay values may correspond, for example, to each respective desired phase shift value at a given frequency.

TABLE 3

| Desired Delay Value |
|---|
| 100 ns |
| 200 ns |
| 300 ns |
| 400 ns |
| 500 ns |

A set of measured delay values such as shown in Table 4 may be generated for the given delay line circuit by measuring the actual electrical delay through various combinations of signal paths possible between an input signal and output signal of the delay line circuit, e.g., in one embodiment all combinations of delay element settings for each of N delay elements 200 through 204 may be measured. It is possible that each of N delay elements 200 through 204 may be originally configured to have specific target measured delay values and/or that a number of N delay elements 200 through 204 may be provided so as to provide a target number of different combinations of delay element settings in the signal path between an input signal and output signal of the delay line circuit. However, it is also possible that N delay elements 200 through 204 may be originally configured independent to any given specific target measured delay values and/or target number of different combinations of delay element settings required or desired for a given application, but later adapted to the given application using the calibration techniques disclosed herein.

TABLE 4

| Measured Delay Value |
|---|
| 47 ns |
| 98 ns |
| 152 ns |
| 193 ns |
| 280 ns |
| 358 ns |
| 411 ns |
| 467 ns |
| 502 ns |
| 574 ns |
| 611 ns |

Each given desired value in Table 3 may then be correlated to a measured value of Table 4, for example, to a measured value that is closest in numerical value to the given desired value. Table 5 illustrates a correlation of the desired values of Table 3 to corresponding chosen measured values of Table 4. The delay bit selection (DlyBitSel) value corresponding to each of the chosen measured delay values may then be stored in a memory device of a delay line circuit, e.g., as part of a primary lookup table such as illustrated by Tables 1 and 2.

TABLE 5

| Desired Delay Value of Table 3 | Corresponding Chosen Measured Delay Value of Table 4 |
|---|---|
| 100 ns | 98 ns |
| 200 ns | 193 ns |
| 300 ns | 280 ns |
| 400 ns | 411 ns |
| 500 ns | 502 ns |

In the practice of the disclosed systems and methods, a given delay line circuit may be calibrated using any method suitable for measuring one or more measured delay values (e.g., delay values as measured through one or more delay elements of the delay line circuitry), and assigning the measured delay value/s to one or more corresponding predefined or desired delay values. In this regard, any selection criteria suitable for selecting a measured delay value for assignment to a corresponding predefined or desired delay value may be employed. For example, in a case involving multiple measured delay values and multiple predefined delay values, a measured delay line value that is numerically closest to each given predefined delay value may be selected and assigned to the given predefined delay value, e.g., in a manner illustrated and described in relation to Table 5 above. In the case where two measured delay values are equally numerically close to a given predefined delay value (e.g., a first measured delay value numerically greater than the predefined delay value and a second measured delay value numerically less than the predefined delay value), predefined selection rules may be specified (e.g., numerically greater measured delay value always selected, numerically lesser measured delay value always selected, random choice between numerically greater and lesser measured delay values, etc.).

In a phase shifting embodiment, it will be understood that multiple predefined delay values may be selected that correspond to each respective desired phase shift value at a given frequency. In this regard, more than one delay value may correspond to a given phase shift value due to the periodic relationship between different phase values (e.g., 0°=360°=720°, etc.). In such an embodiment, a desired phase shift value may be achieved by selecting only one measured delay value that corresponds to the desired phase shift value at the desired frequency. However, the pool of measured delay values from which such a selection is made may be greater than is the case when selecting a measured delay value that corresponds to a single predefined delay value. In the latter case, it is possible to configure number and/or characteristics of delay elements of a delay line circuit to achieve values that overlap or otherwise meet the desired delay values. In this regard, for an application having a minimum difference ($\Delta_{min}$) in delay value between any given two desired delay values, a delay line circuit may be configured with at least one delay element having a designed delay value equal to about one-half ($\Delta_{min}/2$) the minimum difference in delay values to help ensure that all desired delay values are achievable for the given application. It will be understood that it is possible to configure number and/or characteristics of delay elements of a delay line circuit to achieve values that overlap or otherwise meet the desired delay values for any other type of given application, e.g., to achieve phase shift value/s with a minimum number of delay elements, etc.

It will also be understood that calibration of delay line circuitry may be performed in a manual manner, automatic manner, or using any combination thereof. In this regard, calibration of delay line circuitry may be performed, for example, by manual measurement and/or assignment of measured delay values to corresponding predefined delay values, automated measurement and/or assignment of measured delay values to corresponding predefined delay values, or a combination thereof.

In one exemplary embodiment, an automated calibration method may be implemented for the exemplary delay line circuit 104 of FIG. 2 using any hardware, firmware and/or software based test algorithm or other test routine that is suitable for measuring the actual electrical delay values through various combinations of signal paths possible between input signal 220 and output signal 232 of delay line circuit 104, and for storing these measured delay values (or a value representative thereof) in the memory device/s 211 of delay element control circuitry 210. Such a test routine may be implemented, for example, using a hardware, firmware and/or software test module/circuitry configured as an integral part of delay line circuit 104, or configured as a separate external module (e.g., portable test module) that is only coupled to delay line circuit 104 during calibration operations, e.g., during device assembly operations or during later device reconfiguration operations.

For example, a standalone PC or any other suitable processor/processing unit running automated test software (e.g., such as HP Vee or National Instruments Lab View) may be implemented in one embodiment to control a network analyzer that is connected to input signal 220 and output signal 232 of circuit 104. The PC may also be connected to the interface connector 152 such that the PC may automatically measure one or more delay path combinations (e.g., in one embodiment automatically measure all delay path combinations). The PC may then use an algorithm to determine what values to program into the memory device 211 and transfer the data to the interface connector 152.

Referring again to the exemplary embodiment of FIG. 2, delay line circuit 104 may be implemented in one embodiment as a unit having an external connector that is accessible from outside the delay line circuit unit and that houses external control lines (not shown) for FLASH memory device/s 211, e.g., to allow external control of FLASH memory device/s 211 by an external test module. Such a FLASH memory control line connector may be a shared connector (e.g., main interface connector 362), or may be a separate external connector to interface connector 362. In either case, such an external connector may be provided to allow external hardware, firmware and/or software to store information into FLASH memory device/s 211 during automated and/or manual calibration testing of delay line circuit 104 without requiring disassembly of the delay line circuit unit. During normal signal processing operations (e.g., non-calibration testing operations), external FLASH memory device control lines may be left floating. Internal pull-up resistors may be provided on the external FLASH memory device control lines to prevent the possibility of data corruption during normal operations.

In one exemplary embodiment, a secondary table may be programmed into a memory device of a delay line circuit, e.g., memory device 211 of delay line circuit 104. Such a secondary table may be provided as a "pass through" table to allow direct control of the individual delay elements (e.g., N delay elements 200 through 204 of delay line circuitry 104) without requiring additional hardware to bypass the memory device of the delay line circuitry. Such a direct control capability may be desirable, for example, to facilitate testing of the delay line circuit. When so implemented, such a secondary table does not function as a typical lookup table, but instead acts to pass through or relay information received by delay element control circuitry to control individual delay elements of the delay line circuitry, e.g., to pass through information received from control signal 152 directly to bias circuitry 366).

It will be understood that multiple lookup tables (e.g., multiple primary lookup tables and/or secondary lookup tables) and/or other suitable forms of delay element setting information may be stored in a memory device of delay line circuitry. For example, it is possible that two separate primary lookup tables may be provided, with a first one of the lookup tables corresponding to a first frequency range and a second one of the lookup tables corresponding to a second and different frequency range. Selection of the appropriate primary lookup table may then be made using information provided in a control signal received by delay element control circuitry of the delay line circuitry.

Figure 4:
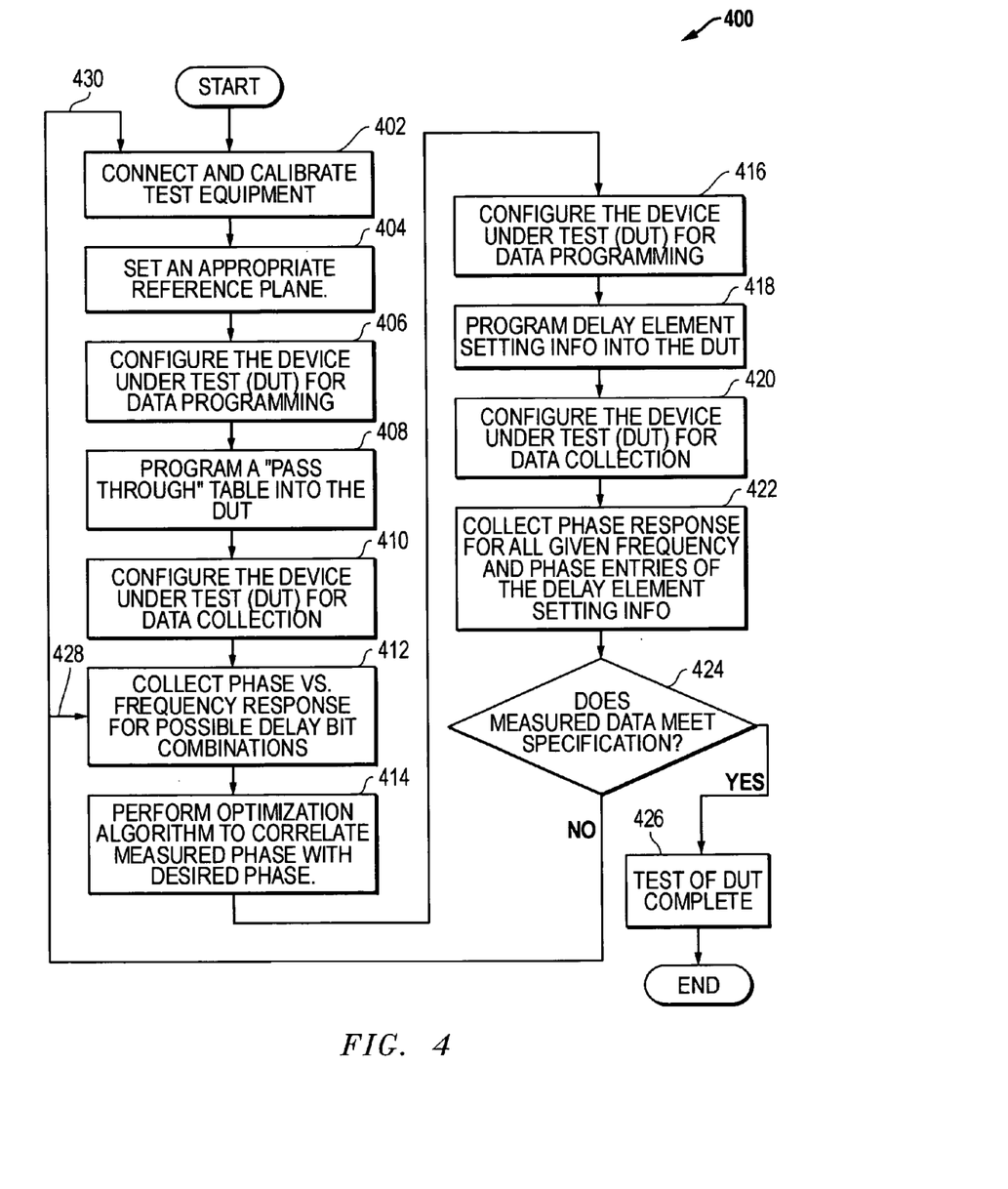
FIG. 4 is a flow diagram of a calibration test algorithm according to one embodiment of the disclosed systems and methods.

FIG. 4 is a flow diagram illustrating one exemplary embodiment of a calibration test algorithm 400 that may be implemented in the practice of the disclosed systems and methods, e.g., to calibrate delay line circuitry 104 of FIG. 2. In this regard, the exemplary methodology of FIG. 4 is directed toward calibration of delay line circuitry that is implemented in a phase shifting embodiment, it being understood that similar methodology may be implemented for other types of delay line circuitry implementations.

As shown, algorithm 400 of FIG. 4 may start in step 402 with connection of test equipment (e.g., external test module) to the delay line circuitry or device under test ("DUT"), and with calibration of the test equipment. It will be understood that for an embodiment where a calibration test algorithm is implemented as part of delay line circuitry as an internal module, that step 402 may not be required. An appropriate reference plane may then be set in step 404 (e.g., such as calibration plane, item bypass, etc.), and the DUT configured for data programming in step 406. Next, a "pass through" table may be programmed into the DUT in step 408 for control of the individual delay elements of the delay line circuitry, and the DUT configured for data collection in step 410.

In steps 412 through 418 of FIG. 4, delay element setting information may be derived that characterizes phase shifting capabilities of the delay line circuit, e.g., a table that indexes delay bit selections (DlyBitSel) by frequency (F) and phase shift (PS). In this regard, phase versus frequency response for one or more (e.g., all) possible delay bit combinations may be first collected in step 412, e.g., in a manner such as described in relation to Table 4 herein. An optimization algorithm may be performed to correlate measured phase with desired phase in step 414, e.g., such as the correlation of the desired values of Table 3 to corresponding chosen measured values of Table 4 described in relation to Table 5 herein. The DUT may be next configured for data programming in step 416, and the collected delay element setting information programmed into the memory device/s of the DUT in step 418, e.g., as delay bit selection values of a delay circuit primary look up table such as described in relation to Tables 1 and 2 herein.

Still referring to FIG. 4, the delay element setting information obtained from the calibration steps of steps 402 through 418 may be tested or evaluated in steps 420 to 424. In this regard, the DUT may be configured for data collection in step 420, and the phase response measured and collected in step 422 for one or more (e.g., all) given frequency and phase entries of the delay element setting information. The measured phase response data may then be evaluated against specifications (e.g., actual phase shift values compared to desired phase shift values). If the measured data meets specifications, the calibration of the DUT is completed in step 426. However, if the measured data does not meet specifications, one or more portions of algorithm 400 may be repeated. For example, as indicated by flow path 428, phase versus frequency response for possible delay bit combinations may be collected again in step 412 and steps 414 through 424 repeated. Alternatively, test equipment may be re-connected and/or re-calibrated and the entire algorithm repeated again as indicated by flow path 430 (e.g., if repeating steps 412 through 424 again results in measure data that does not meet specifications). It will be understood that flow paths 428 and 439 are exemplary only, and that any one or more other selected portions of algorithm 400 may be repeated in other embodiments as necessary or desired.

It will be understood that the methodology described and illustrated with respect to FIG. 4 is exemplary only, and that one or more of the illustrated steps may be absent from a calibration test algorithm, and/or that such a calibration algorithm may be performed with one or more additional or substitute steps.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Delay line circuitry configured to receive and delay an input signal to produce a delayed output signal, said delay line circuitry comprising:

a plurality of delay elements; and delay element control circuitry configured to control said plurality of delay elements to produce said delayed output signal based at least in part on delay element setting information provided by at least one memory device;

wherein said at least one memory device comprises a non-volatile memory device; and wherein said delay line circuitry comprises a phase shifting device, and wherein said input signal comprises a radio frequency (RF) signal.

2. The delay line circuitry of claim 1, wherein said delay element control circuitry comprises said at least one memory device.

3. The delay line circuitry of claim 2, wherein said at least one memory device comprises a FLASH memory device.

4. Delay line circuitry configured to receive and delay an input signal to produce a delayed output signal, said delay line circuitry comprising:

a plurality of delay elements; and delay element control circuitry configured to control said plurality of delay elements to produce said delayed output signal based at least in part on delay element setting information provided by at least one memory device;

wherein said at least one memory device comprises a non-volatile memory device;

wherein said delay element control circuitry comprises said at least one memory device; and wherein said delay element control circuitry is further configured to receive a control signal comprising control information that is at least partially indicative of a desired signal delay to be imparted to said input signal by said delay line circuitry, and to determine a delay bit selection for said plurality of delay elements using said delay element setting information and based at least in part on said control information that is at least partially indicative of a desired signal delay.

5. The delay line circuitry of claim 4, wherein said delay element control circuitry is further configured to receive a control signal comprising control information that is at least partially indicative of a frequency of said input signal, and wherein said delay element control circuitry is further configured to determine a delay bit selection for said plurality of delay elements using said delay element setting information and based at least in part on said control information that is at least partially indicative of a desired signal delay and based at least in part on said control information that is at least partially indicative of a frequency of said input signal.

6. The delay line circuitry of claim 5, wherein said delay line circuitry comprises a phase shifting device, and wherein said input signal comprises a radio frequency (RF) signal.

7. Delay line circuitry configured to receive and delay an input signal to produce a delayed output signal, said delay line circuitry comprising:
   a plurality of delay elements; and
   delay element control circuitry configured to control said plurality of delay elements to produce said delayed output signal based at least in part on delay element setting information provided by at least one memory device;
   wherein said at least one memory device comprises a non-volatile memory device; and
   wherein said delay element setting information is at least partially derived by measurement of actual signal delay values through two or more combinations of signal paths through said plurality of delay elements of said delay line circuitry.

8. Delay line circuitry configured to receive and delay an input signal to produce a delayed output signal, said delay line circuitry comprising:
   a plurality of delay elements; and
   delay element control circuitry configured to control said plurality of delay elements to produce said delayed output signal based at least in part on delay element setting information provided by at least one memory device;
   wherein said at least one memory device comprises a non-volatile memory device; and
   wherein said delay element setting information is at least partially derived by automated measurement and storage into said at least one memory device of actual signal delay values through two or more combinations of signal paths through said plurality of delay elements of said delay line circuitry.

9. The delay line circuitry of claim 8, further comprising integral test circuitry configured to derive said delay element setting information and to provide said delay element setting information for storage in said at least one memory device.

10. Delay line circuitry configured to receive and delay an input signal to produce a delayed output signal, said delay line circuitry comprising:
    a plurality of delay elements; and
    delay element control circuitry configured to control said plurality of delay elements to produce said delayed output signal, said delay element control circuitry comprising at least one memory device;
    wherein said at least one memory device comprises a non-volatile memory device; and
    wherein said delay line circuitry comprises a phase shifting device, and wherein said input signal comprises a radio frequency (RF) signal.

11. The delay line circuitry of claim 10, wherein said at least one memory device comprises a FLASH memory device.

12. Delay line circuitry configured to receive and delay an input signal to produce a delayed output signal, said delay line circuitry comprising:
    a plurality of delay elements; and
    delay element control circuitry configured to control said plurality of delay elements to produce said delayed output signal, said delay element control circuitry comprising at least one memory device;
    wherein said at least one memory device comprises a non-volatile memory device;
    wherein said at least one memory device is configured to store delay element setting information; and wherein said delay element setting information is at least partially derived by measurement of actual signal delay values through two or more combinations of signal paths through said plurality of delay elements of said delay line circuitry.

13. The delay line circuitry of claim 12, wherein said at least one memory device is configured to store delay element setting information; and wherein said delay element setting information is at least partially derived by automated measurement and storage into said at least one memory device of actual signal delay values through two or more combinations of signal paths through said plurality of delay elements of said delay line circuitry.

14. The delay line circuitry of claim 12, further comprising integral test circuitry configured to derive said delay element setting information by measuring actual signal delay values through two or more combinations of signal paths through said plurality of delay elements of said delay line circuitry, and to provide said delay element setting information for storage in said at least one memory device.

15. The delay line circuitry of claim 13, wherein said delay line circuitry comprises a phase shifting device, and wherein said input signal comprises a radio frequency (RF) signal.

16. A phased array apparatus, comprising:
    a plurality of array elements; and
    a plurality of phase shifting devices, each of said plurality of phase shifting devices being coupled to a respective one of said plurality of array elements;
    wherein each of said plurality of phase shifting devices comprises a plurality of delay elements, and delay element control circuitry configured to control said plurality of delay elements based at least in part on delay element setting information provided by at least one memory device.

17. The phased array apparatus of claim 16, wherein said delay element control circuitry of each of said respective plurality of phase shifting devices comprises at least one memory device configured to provide said delay element setting information to said respective phase shifting device.

18. The phased array apparatus of claim 17, wherein said at least one memory device of each of said respective plurality of phase shifting devices comprises a FLASH memory device.

19. The phased array apparatus of claim 16, wherein said delay element control circuitry of each of said respective plurality of phase shifting devices comprises at least one memory device and is configured to receive a control signal comprising control information that is at least partially indicative of a desired phase shift to be imparted to an input signal by said phase shift device; and wherein said delay element control circuitry of each of said respective phase shifting devices is configured to determine a delay bit selection for said plurality of delay elements of said respective phase shifting device using said delay element setting information provided by said at least one memory device of said respective phase shift device and based at least in part on said control information that is at least partially indicative of said desired phase shift to be imparted to said input signal by said respective phase shift device.

20. The phased array apparatus of claim 19, wherein said delay element control circuitry of each of said respective plurality of phase shifting devices is configured to receive a control signal comprising control information that is at least partially indicative of a frequency of said input signal to said respective phase shift device; and wherein said delay element control circuitry of each of said respective phase shifting devices is configured to determine a delay bit selection for said plurality of delay elements of said respective phase shifting device using said delay element setting information provided by said at least one memory device of said respective phase shift device and based at least in part on said control information that is at least partially indicative of said desired phase shift to be imparted to said input signal by said respective phase shift device and based at least in part on said control information that is at least partially indicative of a frequency of said input signal to said respective phase shift device.

21. The phased array apparatus of claim 16, wherein said phased array apparatus comprises a radio frequency (RF) antenna; wherein each of said delay elements is configured to receive and delay an input signal to produce a delayed output signal; and wherein said input signal to each of said delay elements comprises a radio frequency (RF) signal.

22. The phased array apparatus of claim 16, wherein said delay element setting information comprises a look-up table of delay bit selection values for said plurality of delay elements.

23. The phased array apparatus of claim 16, wherein said delay element setting information for each of said respective phase shifting devices is at least partially derived by measurement of actual signal delay values through two or more combinations of signal paths through said plurality of delay elements of said respective phase shifting device.

24. The phased array apparatus of claim 16, wherein said delay element setting information for each of said respective phase shifting devices is at least partially derived by automated measurement and storage into said at least one memory device of actual signal delay values through two or more combinations of signal paths through said plurality of delay elements of said respective phase shifting device.

25. The phased array apparatus of claim 16, wherein said at least one memory device of each of said respective plurality of phase shifting devices comprises a non-volatile memory device.

26. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; wherein said at least one memory device comprises a non-volatile memory device; wherein said input signal comprises a radio frequency (RF) signal; and wherein said method further comprises delaying said RF input signal to produce a delayed RF output signal having a phase that is shifted relative to a phase of said RF input signal.

27. The method of claim 26, wherein said at least one memory device comprises a FLASH memory device.

28. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; wherein said at least one memory device comprises a non-volatile memory device; and further comprising deriving said delay element setting information at least partially by measuring actual signal delay values through two or more combinations of signal paths through said plurality of delay elements; and storing said delay element setting information in said at least one memory device.

29. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; wherein said at least one memory device comprises a non-volatile memory device; and further comprising deriving said delay element setting information at least partially by automatically measuring actual signal delay values through two or more combinations of signal paths through said plurality of delay elements; and automatically storing said delay element setting information in said at least one memory device.

30. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; wherein said at least one memory device comprises a non-volatile memory device; wherein said delay element setting information comprises two or more delay bit selection values for said plurality of delay elements; and wherein said method further comprises deriving said delay bit selection values by measuring actual signal delay values through two or more combinations of signal paths through said plurality of delay elements between said input signal and said delayed output signal, and storing said delay bit selection values in said at least one memory device.

31. The method of claim 30, further comprising receiving a control signal comprising control information that is at least partially indicative of a desired signal delay to be imparted to said input signal by said delay line circuitry; and determining a delay bit selection for said plurality of delay elements using said delay element setting information and based at least in part on said control information that is at least partially indicative of a desired signal delay.

32. The method of claim 31, further comprising receiving a control signal comprising control information that is at least partially indicative of a frequency of said input signal; and determining a delay bit selection for said plurality of delay elements using said delay element setting information and based at least in part on said control information that is at least partially indicative of a desired signal delay and based at least in part on said control information that is at least partially indicative of a frequency of said input signal.

33. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; wherein said at least one memory device comprises a non-volatile memory device; wherein said delay line circuitry comprises a phase shifting device, and wherein said input signal comprises a radio frequency (RF) signal.

34. A method of operating a phased array apparatus, comprising:
providing a plurality of array elements; and
providing a plurality of phase shifting devices, each of said plurality of phase shifting devices comprising a plurality of delay elements and being coupled to a respective one of said plurality of array elements;
varying the phase of a signal transmitted or received by each respective one of said array elements by controlling said plurality of delay elements of said respective phase shifting device coupled to said respective array element based at least in part on delay element setting information provided by at least one memory device.

35. The method of claim 34, wherein each of said plurality of phase shifting devices further comprises at least one memory device configured to provide said delay element setting information to said respective phase shifting device.

36. The method of claim 35, wherein said at least one memory device of each of said respective plurality of phase shifting devices comprises a FLASH memory device.

37. The method of claim 34, further comprising deriving said delay element setting information for each of said respective phase shifting devices at least partially by measuring actual signal delay values through two or more combinations of signal paths through said plurality of delay elements of said respective phase shifting device; and storing said delay element setting information in said at least one memory device.

38. The method of claim 34, further comprising deriving said delay element setting information for each of said respective phase shifting devices at least partially by automatically measuring actual signal delay values through two or more combinations of signal paths through said plurality of delay elements of said respective phase shifting device; and automatically storing said delay element setting information in said at least one memory device.

39. The method of claim 34, wherein said delay element setting information comprises two or more delay bit selection values for said plurality of delay elements of each of said respective phase shifting devices; and wherein said method further comprises deriving said delay bit selection values by measuring actual signal delay values through two or more combinations of signal paths through said plurality of delay elements of each of said respective phase shifting devices, and storing said delay bit selection values in said at least one memory device.

40. The method of claim 39, further comprising receiving a control signal comprising control information that is at least partially indicative of a desired phase shift to be imparted to an input signal by at least one of said respective phase shift devices; and determining a delay bit selection for said plurality of delay elements of said respective phase shifting device using said delay element setting information provided by said at least one memory device and based at least in part on said control information that is at least partially indicative of said desired phase shift to be imparted to said input signal by said respective phase shift device.

41. The method of claim 40, further comprising receiving a control signal comprising control information that is at least partially indicative of a frequency of said input signal to said respective phase shift device; and determining a delay bit selection for said plurality of delay elements of said respective phase shifting device using said delay element setting information provided by said at least one memory device and based at least in part on said control information that is at least partially indicative of said desired phase shift to be imparted to said input signal by said respective phase shift device and based at least in part on said control information that is at least partially indicative of a frequency of said input signal to said respective phase shift device.

42. The method of claim 34, wherein said phased array apparatus comprises a radio frequency (RF) antenna; wherein each of said delay elements is configured to receive and delay an input signal to produce a delayed output signal; and wherein said input signal to each of said delay elements comprises a radio frequency (RF) signal.

43. The method of claim 34, wherein said delay element setting information comprises a look-up table of delay bit selection values for said plurality of delay elements.

44. The method of claim 34, wherein said at least one memory device of each of said respective plurality of phase shifting devices comprises a non-volatile memory device.

45. Test circuitry configured for coupling to delay line circuitry that has a plurality of delay elements and that has delay element control circuitry configured to control said plurality of delay elements to produce a delayed output signal based at least in part on delay element setting information provided by at least one memory device, said test circuitry comprising:
circuitry configured to derive said delay element setting information for storage in said memory device;
wherein said at least one memory device comprises a non-volatile memory device;
wherein said test circuitry comprises circuitry external to said delay line circuitry; and
wherein said external circuitry of said test circuitry is further configured to derive said delay element setting information by measuring actual signal delay values through two or more combinations of signal paths through said plurality of delay elements of said delay line circuitry, and to provide said delay element setting information for storage in said at least one memory device.

46. Delay line circuitry configured to receive and delay an input signal to produce a delayed output signal, said delay line circuitry comprising:
a plurality of delay elements; and
delay element control circuitry configured to control said plurality of delay elements to produce said delayed output signal based at least in part on delay element setting information provided by at least one memory device;
wherein said delay element setting information is at least partially derived by measurement of actual signal delay values through two or more combinations of signal paths through said plurality of delay elements of said delay line circuitry.

47. The delay line circuitry of claim 46, wherein said delay element setting information is at least partially derived by automated measurement and storage into said at least one memory device of actual signal delay values through two or more combinations of signal paths through said plurality of delay elements of said delay line circuitry.

48. The delay line circuitry of claim 47, further comprising integral test circuitry configured to derive said delay element setting information and to provide said delay element setting information for storage in said at least one memory device.

49. Delay line circuitry configured to receive and delay an input signal to produce a delayed output signal, said delay line circuitry comprising:
a plurality of delay elements; and
delay element control circuitry configured to control said plurality of delay elements to produce said delayed output signal based at least in part on delay element setting information provided by at least one memory device;

wherein said delay line circuitry comprises a phase shifting device, and wherein said input signal comprises a radio frequency (RF) signal.

50. The delay line circuitry of claim 49, wherein said delay element control circuitry comprises said at least one memory device; wherein said delay element control circuitry is further configured to receive a control signal comprising control information that is at least partially indicative of a desired signal delay to be imparted to said input signal by said delay line circuitry, and to determine a delay bit selection for said plurality of delay elements using said delay element setting information and based at least in part on said control information that is at least partially indicative of a desired signal delay; and wherein said delay element control circuitry is further configured to receive a control signal comprising control information that is at least partially indicative of a frequency of said input signal, and wherein said delay element control circuitry is further configured to determine a delay bit selection for said plurality of delay elements using said delay element setting information and based at least in part on said control information that is at least partially indicative of a desired signal delay and based at least in part on said control information that is at least partially indicative of a frequency of said input signal.

51. Delay line circuitry configured to receive and delay an input signal to produce a delayed output signal, said delay line circuitry comprising:

a plurality of delay elements; and delay element control circuitry configured to control said plurality of delay elements to produce said delayed output signal, said delay element control circuitry comprising at least one memory device;

wherein said at least one memory device is configured to store delay element setting information; and wherein said delay element setting information is at least partially derived by measurement of actual signal delay values through two or more combinations of signal paths through said plurality of delay elements of said delay line circuitry.

52. The delay line circuitry of claim 51, wherein said at least one memory device is configured to store delay element setting information; and wherein said delay element setting information is at least partially derived by automated measurement and storage into said at least one memory device of actual signal delay values through two or more combinations of signal paths through said plurality of delay elements of said delay line circuitry.

53. The delay line circuitry of claim 52, wherein said delay line circuitry comprises a phase shifting device, and wherein said input signal comprises a radio frequency (RF) signal.

54. The delay line circuitry of claim 51, further comprising integral test circuitry configured to derive said delay element setting information by measuring actual signal delay values through two or more combinations of signal paths through said plurality of delay elements of said delay line circuitry, and to provide said delay element setting information for storage in said at least one memory device.

55. Delay line circuitry configured to receive and delay an input signal to produce a delayed output signal, said delay line circuitry comprising:

a plurality of delay elements; and delay element control circuitry configured to control said plurality of delay elements to produce said delayed output signal, said delay element control circuitry comprising at least one memory device;

wherein said delay line circuitry comprises a phase shifting device, and wherein said input signal comprises a radio frequency (RF) signal.

56. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; and further comprising deriving said delay element setting information at least partially by measuring actual signal delay values through two or more combinations of signal paths through said plurality of delay elements; and storing said delay element setting information in said at least one memory device.

57. The method of claim 56, further comprising deriving said delay element setting information at least partially by automatically measuring actual signal delay values through two or more combinations of signal paths through said plurality of delay elements; and automatically storing said delay element setting information in said at least one memory device.

58. The method of claim 56, wherein said delay element setting information comprises two or more delay bit selection values for said plurality of delay elements; and wherein said method further comprises deriving said delay bit selection values by measuring actual signal delay values through two or more combinations of signal paths through said plurality of delay elements between said input signal and said delayed output signal, and storing said delay bit selection values in said at least one memory device.

59. The method of claim 58, further comprising receiving a control signal comprising control information that is at least partially indicative of a desired signal delay to be imparted to said input signal by said delay line circuitry; and determining a delay bit selection for said plurality of delay elements using said delay element setting information and based at least in part on said control information that is at least partially indicative of a desired signal delay.

60. The method of claim 59, further comprising receiving a control signal comprising control information that is at least partially indicative of a frequency of said input signal; and determining a delay bit selection for said plurality of delay elements using said delay element setting information and based at least in part on said control information that is at least partially indicative of a desired signal delay and based at least in part on said control information that is at least partially indicative of a frequency of said input signal.

61. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; and wherein said delay line circuitry comprises a phase shifting device, and wherein said input signal comprises a radio frequency (RF) signal.

62. A method of delaying an input signal to produce a delayed output signal using a plurality of delay elements coupled to receive and delay said input signal to produce said delayed output signal, said method comprising controlling said plurality of delay elements to produce said delayed output signal based at least in part on delay element setting information provided by at least one memory device; and wherein said input signal comprises a radio frequency (RF) signal; and wherein said method further comprises delaying said RF input signal to produce a delayed RF output signal having a phase that is shifted relative to a phase of said RF input signal.

63. Test circuitry configured for coupling to delay line circuitry that has a plurality of delay elements and that has delay element control circuitry configured to control said plurality of delay elements to produce a delayed output signal based at least in part on delay element setting information provided by at least one memory device, said test circuitry comprising:

circuitry configured to derive said delay element setting information for storage in said memory device;

wherein said test circuitry comprises circuitry external to said delay line circuitry; and wherein said external circuitry of said test circuitry is further configured to derive said delay element setting information by measuring actual signal delay values through two or more combinations of signal paths through said plurality of delay elements of said delay line circuitry, and to provide said delay element setting information for storage in said at least one memory device.

* * * * *